(12) United States Patent
Theuss et al.

(10) Patent No.: US 8,130,506 B2
(45) Date of Patent: Mar. 6, 2012

(54) SENSOR MODULE (75) Inventors: Horst Theuss, Wenzenbach (DE); Bernd Stadler, Donaustauf (DE)

(73) Assignee: Infineon Technologies AG, Neubiberg (DE)

( * ) Notice: Subject to any disclaimer, the term of this patent is extended or adjusted under 35 U.S.C. 154(b) by 227 days.

(21) Appl. No.: 12/142,380

(22) Filed: Jun. 19, 2008

(65) Prior Publication Data
US 2009/0313817 A1    Dec. 24, 2009

(51) Int. Cl.
*H05K 7/00* (2006.01)
(52) U.S. Cl. .......................... 361/760; 174/250; 257/414
(58) Field of Classification Search .................. 361/760; 174/250; 257/414
See application file for complete search history.

(56) References Cited

U.S. PATENT DOCUMENTS

| 5,345,107 | A | 9/1994 | Daikoku et al. |
| 5,455,457 | A | 10/1995 | Kurokawa |
| 7,202,552 | B2 * | 4/2007 | Zhe et al. ...................... 257/659 |
| 2008/0083957 | A1 * | 4/2008 | Wei et al. ...................... 257/415 |
| 2009/0001553 | A1 | 1/2009 | Pahl |
| 2010/0183181 | A1 * | 7/2010 | Wang ............................ 381/361 |

FOREIGN PATENT DOCUMENTS

| DE | 102005053765 |   | 5/2007 |
| EP | 0453764 | A1 | 10/1991 |
| EP | 0693780 | A2 | 1/1996 |
| EP | 0742581 | A2 | 11/1996 |
| WO | WO-2007054070 |   * | 11/2006 |

* cited by examiner

*Primary Examiner* — Yuriy Semenenko
(74) *Attorney, Agent, or Firm* — Dicke, Billig & Czaja, PLLC (57) ABSTRACT

A sensor module. One embodiment provides a cap whose perimeter defines a rim. A first semiconductor chip is attached to the cap. The first semiconductor chip includes first connection elements. The rim and the first connection elements define a common plane.

25 Claims, 11 Drawing Sheets

SENSOR MODULE

BACKGROUND

The invention relates to a sensor module, an assembly, and a method for fabricating an assembly.

Sensor modules and sensor assemblies may contain a sensor like, for example, a micro-electro-mechanical microphone. Typically, such a micro-electro-mechanical microphone is mounted in a casing which is built of several components wherein one component of the casing is typically made of a printed circuit board. Micro-electro-mechanical microphones packaged like this are used to transform sound into electrical signals in applications where a miniaturization is of special interest.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

The aspects and embodiments of the invention are now described with reference to the drawings, wherein like reference numerals are generally utilized to refer to like elements throughout. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiment of the invention. The following description is therefore not to be taken in a limiting sense, and the scope of the invention is defined by the appended claims.

Modules and assemblies described in the following include embodiments of a micro-electro-mechanical microphone which dynamically transforms sound e.g., in the audible frequency range into electrical signals. One embodiment of a module may include a silicon chip containing a microphone based on a capacitor including two electrodes wherein one electrode is made of a thin membrane as already well-known for those skilled in the art.

Further embodiments of modules and assemblies include a cap wherein the first semiconductor chip is attached to the cap. The cap can, for example, be made of an electrically conductive material or it may include a surface being covered with an electrically conductive material. The electrically conductive material can be made of a metal or a metal alloy or any other conductive material like a semiconductor material or a plastic material including electrically conductive properties.

In an assembly a sensor module can be attached to a circuit board. The circuit board can be any type of board including electrical connections like, for example, a printed circuit board (PCB), a multi-layer circuit board, or a leadframe.

Figure 1:
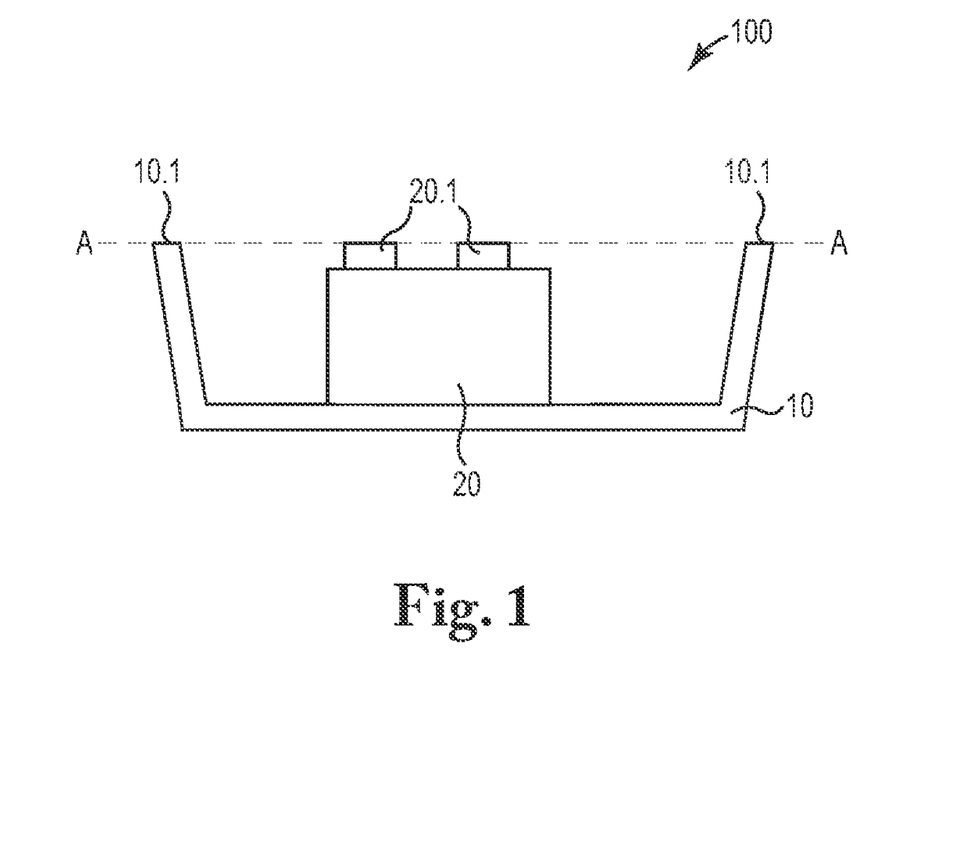
FIG. 1 illustrates a sectional side view of a sensor module according to one embodiment.

Referring to FIG. 1, there is illustrated a sectional side view of a sensor module according to one embodiment. The sensor module 100 includes a cap 10 whose perimeter defines a rim 10.1, a first semiconductor chip 20 attached to the cap 10, wherein the first semiconductor chip 20 includes first connection elements 20.1, and wherein the rim 10.1 and the first connection elements 20.1 define a common plane A.

According to one embodiment of the first embodiment of the sensor module, a second semiconductor chip not illustrated in FIG. 1 and including second connection elements is also attached to the cap 10. In a further embodiment thereof it may be arranged that the first connection elements 20.1 and the second connection elements are electrically disconnected from each other.

According to one embodiment of the sensor module, the cap 10 is made of an electrically conductive material, or the cap 10 includes a surface being covered with an electrically conductive material, in one embodiment essentially completely covered with the electrically conductive material.

According to one embodiment of the sensor module, the sensor module can be a microphone module and the first semiconductor chip can be a micro-electro-mechanical microphone chip. Furthermore, the second semiconductor chip, if available, can be a processor chip like, for example, an ASIC chip, or the like.

Figure 2:
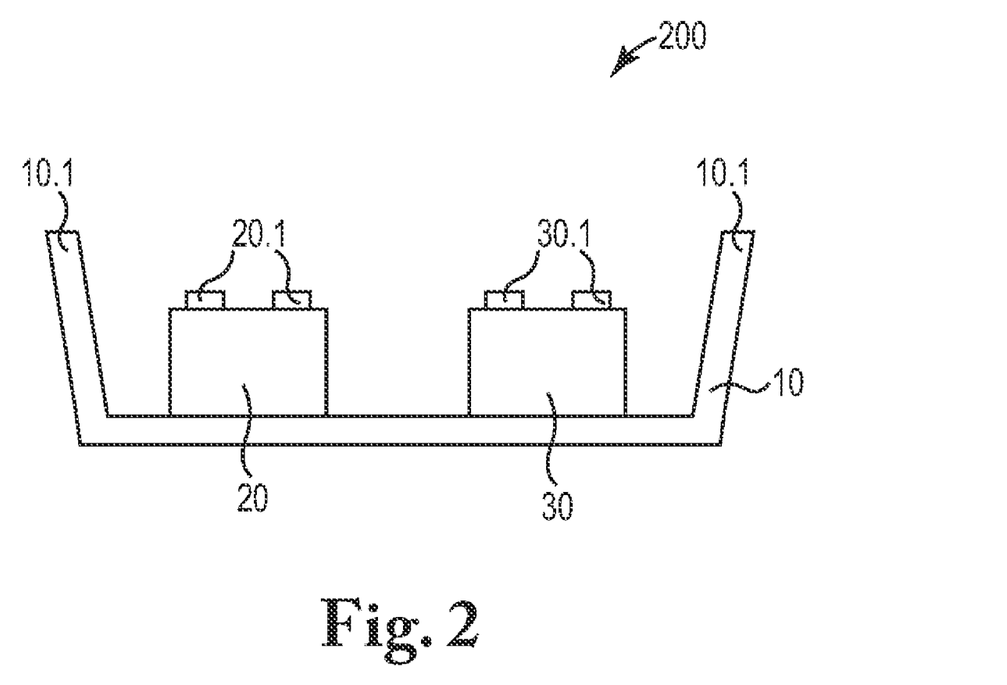
FIG. 2 illustrates a sectional side view of a sensor module according to one embodiment.

Referring to FIG. 2, there is illustrated a sectional side view of a sensor module according to one embodiment. The sensor module 200 of FIG. 2 includes a cap 10 whose perimeter defines a rim 10.1, a first semiconductor chip 20 including first connection elements 20.1 and attached to the cap 10, a second semiconductor chip 30 including second connection elements 30.1 and attached to the cap 10, wherein the first connection elements 20.1 and the second connection elements 30.1 are electrically disconnected from each other.

According to one embodiment of a sensor module, the rim 10.1 and at least one of the first and second connection elements 20.1 and 30.1 define a common plane.

According to one embodiment of a sensor module, the cap 10 is made of an electrically conductive material or the cap 10 includes a surface being covered with an electrically conductive material, in one embodiment being essentially completely covered with an electrically conductive material.

According to one embodiment of a sensor module, at least one of the first and second semiconductor chips 20 and 30 defines a front side and a backside, wherein the backside of the chip is attached to the cap 10 and wherein the connection elements 20.1 or 30.1 of the chip are attached to the front side of the chip.

Figure 3:
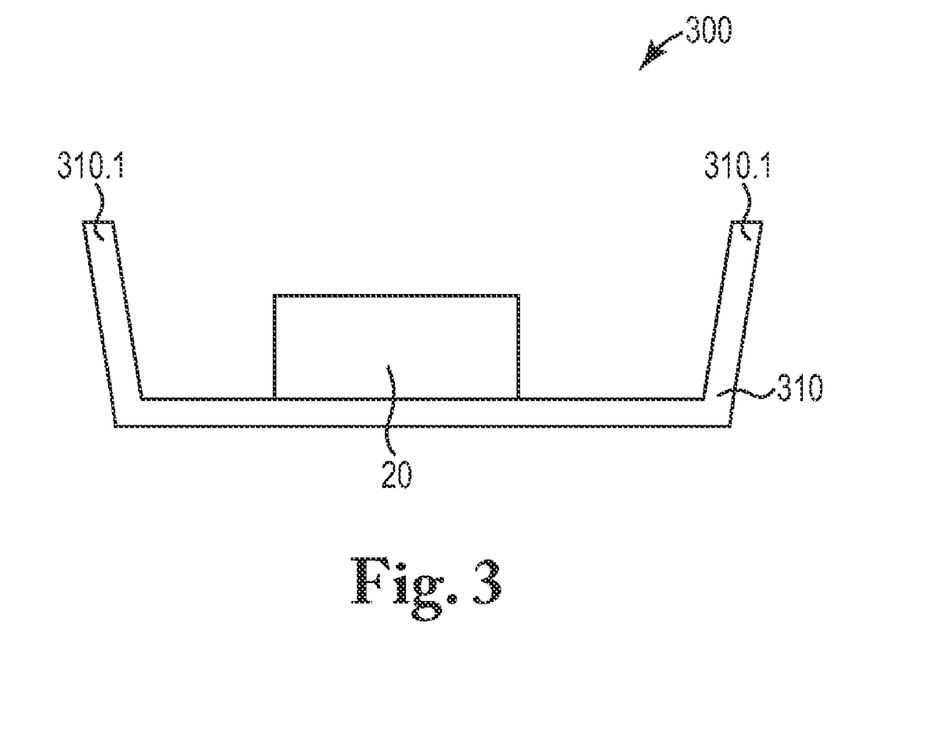
FIG. 3 illustrates a sectional side view of a sensor module according to one embodiment.

Referring to FIG. 3, there is illustrated a sectional side view of one embodiment of a sensor module. The sensor module 300 of FIG. 3 includes a cap 310 made of an electrically conductive material and a first semiconductor chip 20 attached to the cap 310. According to another embodiment, the cap 310 itself is not made of an electrically conductive material, but has a surface being covered with an electrically conductive material. That means part of the surface of the cap 310 or the whole surface of the cap 310 can be covered with an electrically conductive material.

According to one embodiment of the sensor module, the perimeter of the cap 310 defines a rim 310.1 and the first semiconductor chip 20 including first connection elements, and the rim 310.1 and the first connection elements define a common plane.

According to one embodiment of the sensor module a second semiconductor chip includes second connection elements and is attached to the cap 310. In one embodiment, the first connection elements and the second connection elements can be arranged so that they are electrically disconnected from each other.

According to one embodiment of the sensor module, the first semiconductor chip 20 defines a front side and a backside, wherein the backside of the chip 20 is attached to the cap 310 and wherein the connection elements of the chip 20 are attached to the front side of the chip 20. If the sensor module 300 includes a first semiconductor chip and a second semiconductor chip, at least one of the first and second semiconductor chips defines a front side and a backside, wherein the backside of the chip is attached to the cap and wherein the connection elements of the chip are attached to the front side of the chip.

Figure 4A:
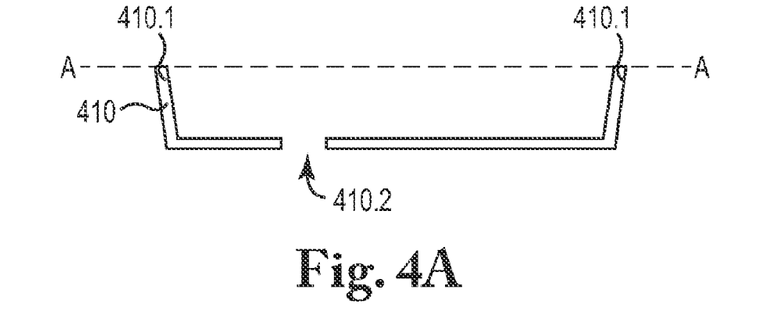
FIGS. 4A, B, C illustrate a section side view of a cap (A), a sectional side view of a module according to a fourth embodiment (B), and a bottom view of the sensor module according to one embodiment (C).
Figure 4B:
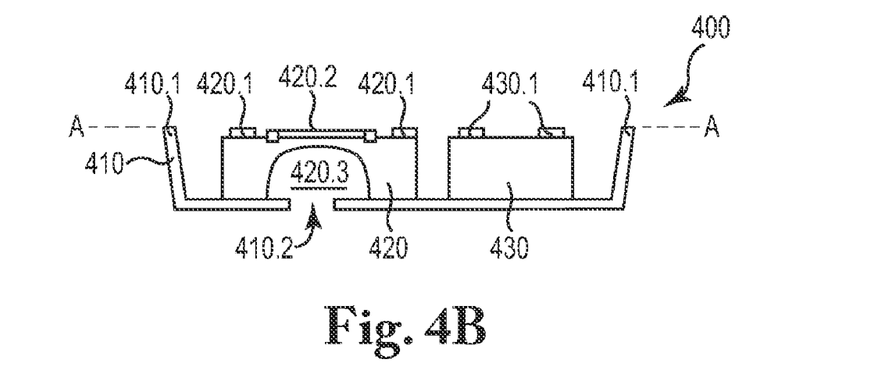
Figure 4C:
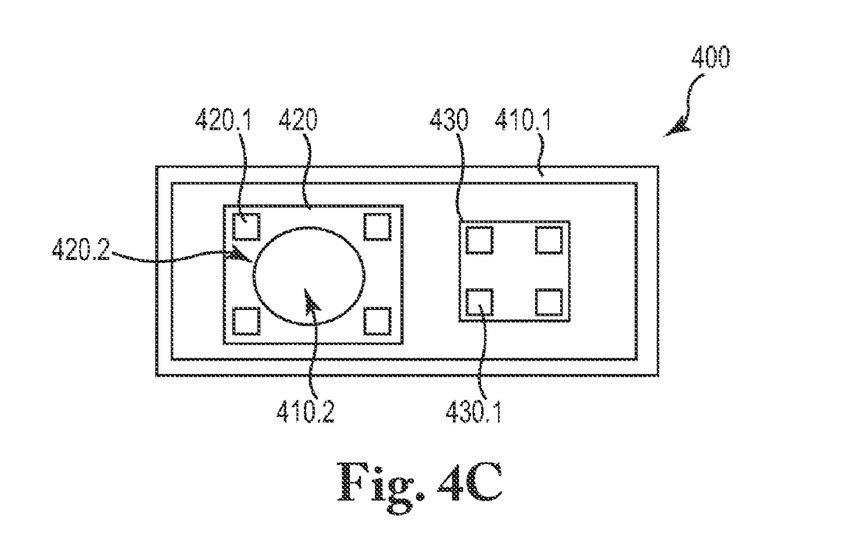

Referring to FIGS. 4A-C, there is illustrated a sectional side view of a cap (A), a sectional side view of one embodiment of a sensor module (B), and a downside view of one embodiment of the sensor module (C). FIG. 4A illustrates a sectional side view of a cap 410 which can be made of an electrically conductive material like a metal or which can be partly or fully covered with an electrically conductive material like a metal. The cap 410 includes a closed rim 410.1 extending within a plane denoted as A indicated with the chain-dotted line. The cap 410 furthermore includes a sound opening 410.2 such that sound can pass through the sound opening 410.2 to reach a sensor element like a membrane to be illustrated further below. The sound opening 410.2 can have a constant circular cross-section, it can be funnel-shaped or its cross-sectional shape can follow a special function, for instance an exponential function. The sound opening 410.2 can be covered by a foil or a felt or a like material and the covering material can be perforated in the area of the sound opening 410.2. As a further embodiment the sound opening 410.2 can be formed as a section of the cap 410 including an arrangement of perforations formed in the wall of the cap 410.

FIG. 4B illustrates a sectional side view of one embodiment of a sensor module. The sensor module 400 includes a cap 410 as illustrated in FIG. 4A and a first semiconductor chip 420 attached to the cap 410 and a second semiconductor chip 430 attached to the cap 410. The first semiconductor chip 420 is a silicon microphone chip including first connection elements 420.1 applied on a front side of the first semiconductor chip 420. As illustrated in FIG. 4C there are provided four connection elements 420.1 each one arranged in the vicinity of one of the four corners of the rectangle shaped front side of the first semiconductor chip 420. The first semiconductor chip 420 further includes a membrane 420.2 fabricated from silicon material which is well-known to those skilled in the art. The first semiconductor chip 420 is attached with a backside surface thereof to the cap 410, in one embodiment to the bottom surface of the cap 410. The first semiconductor chip 420 has been prepared beforehand so that it includes a recess 420.3, the diameter of which essentially corresponds to or is slightly larger than the diameter of the membrane 420.2. The first semiconductor chip 420 is attached to the bottom surface of the cap 410 so that the sound opening 410.2 faces the recess 420.3, in one embodiment is located essentially symmetrical with respect to the recess 420.3. The first semiconductor chip 420 is attached to the cap 410 by any possible conventional technique like, for example, soldering or adhering by using an adhesive material. In one embodiment, it is not necessarily required to hermetically attach the first semiconductor chip 420 with its backside to the cap 410. Even small holes within the attachment zone between the first semiconductor chip 420 and the cap 410 may be accepted as the sound waves would run out in these holes. Moreover, small holes or paths would also have the advantage that moisture could more easily diffused out of the recess 410.3.

A second semiconductor chip 430 is also attached to the bottom surface of the cap 410 and it can be attached in the same way as the first semiconductor chip 420, i.e. by soldering or adhering by using an adhesive material. The second semiconductor chip 430 can be a processor chip like, for example, an ASIC chip arranged to process signals from the first semiconductor chip 420. The second semiconductor chip 430 includes second connection elements 430.1 attached to a front side surface thereof. As illustrated in FIG. 4C, there are provided four second connection elements 430.1 each one of which is arranged in the vicinity of one of the four corners of the rectangle shaped front side surface of the second semiconductor chip 430.

The first semiconductor chip 420 and the second semiconductor chip 430 and the cap 410 are dimensioned such that the rim 410.1 of the cap 410 and the first connection elements 420.1 and the second connection elements 430.1 define a common plane A. This allows an easy and practical mounting of the sensor module 400 to a circuit board which will be outlined further below. A further property of the sensor module 400 is that the first connection elements 420.1 of the first semiconductor chip 420 are disconnected from the second connection elements 430.1 of the second semiconductor chip 430. This allows for an easy fabrication of the sensor module 400 as complicated and cumbersome connection forming procedures like wire-bonding or through-hole forming can be omitted at this stage. The first connection elements 420.1 can be connected to the second connection elements 430.1 when attaching the sensor module 400 to a circuit board as will be outlined further below. A further property of the sensor module 400 is that the cap 410 is made of or covered with an electrically conductive material so that the cap 410 not only functions as a mechanical protection element but also as an electrical shielding element for shielding the first semiconductor chip 420 and the second semiconductor chip 430 from spurious electrical signals from the outside.

Figure 5A:
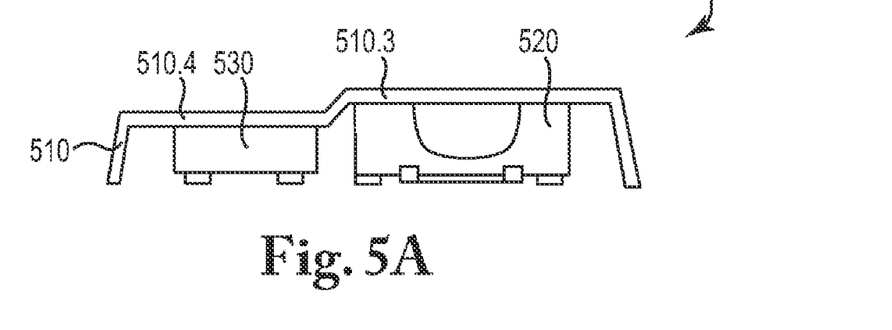
FIG. 5A illustrates a sectional side view of a sensor module according to one embodiment.

Referring to FIG. 5A there is illustrated a sectional side view of a fifth embodiment of a sensor module. The sensor module 500 is similar to the sensor module 400 of FIGS. 4A-C and in the following only the differences to the sensor module 400 of FIG. 4 will be explained. The sensor module 500 is formed so as to cope with semiconductor chips having different vertical extensions. As illustrated in FIG. 5A, a first semiconductor chip 520, which is the silicon microphone chip, has a greater vertical extension than a second semiconductor chip 530 which is a process chip like an ASIC chip or the like. In order that the connection elements of the first and second semiconductor chips will be located in one common plane, it will be necessary to take appropriate measures. The sensor module 500 of the fifth embodiment therefore includes a cap 510 which has a stepped bottom portion including a first deep section 510.3 and a second shallow section 510.4. In the first deep section 510.3 the first semiconductor chip 520 is arranged and in the second shallow section 510.4 the second semiconductor chip 530 is arranged. The difference in deepness between the deep and shallow sections 510.3 and 510.4 is such that it compensates for the difference in the vertical extensions of the first and second semiconductor chips 520 and 530. The transition between the deep and shallow sections 510.3 and 510.4 is formed as an inclined section in the bottom surface of the cap 510. The deep and shallow sections 510.3 and 510.4 include equal thicknesses of the bottom wall of the cap 510.

Figure 5B:
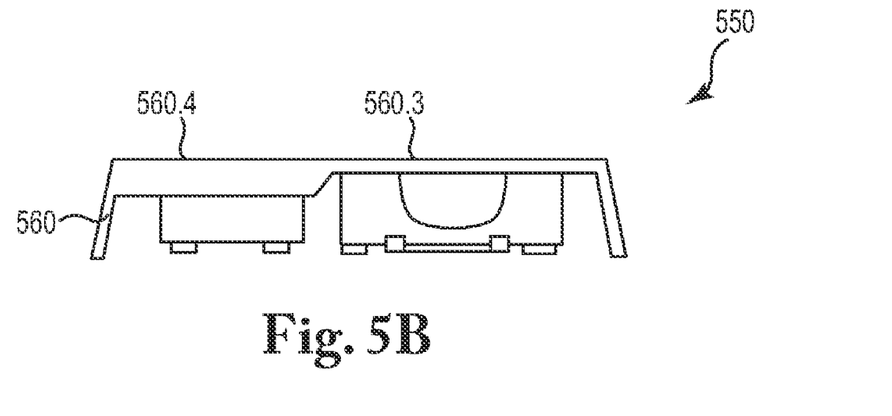
FIG. 5B illustrates a sectional side view of a sensor module according to one embodiment.

Referring to FIG. 5B, there is illustrated a sectional side view of one embodiment of a sensor module. The sensor module 550 in principle serves the same purpose as the sensor module 500 of FIG. 5A, namely to compensate for different vertical extensions of the first and second semiconductor chips. The sensor module 550 includes a cap 560 with a bottom portion containing a first deep section 560.3 and a second shallow section 560.4. In contrast to the sensor module 500 of one embodiment, in the sensor module 550 of one embodiment the wall thicknesses of the bottom portion are different in the deep and shallow sections, i.e. in the second shallow section 560.4 the wall thickness is greater than in the first deep section 560.3 such that the outer surface of the bottom portion of the cap 560 is planar.

Figure 5C:
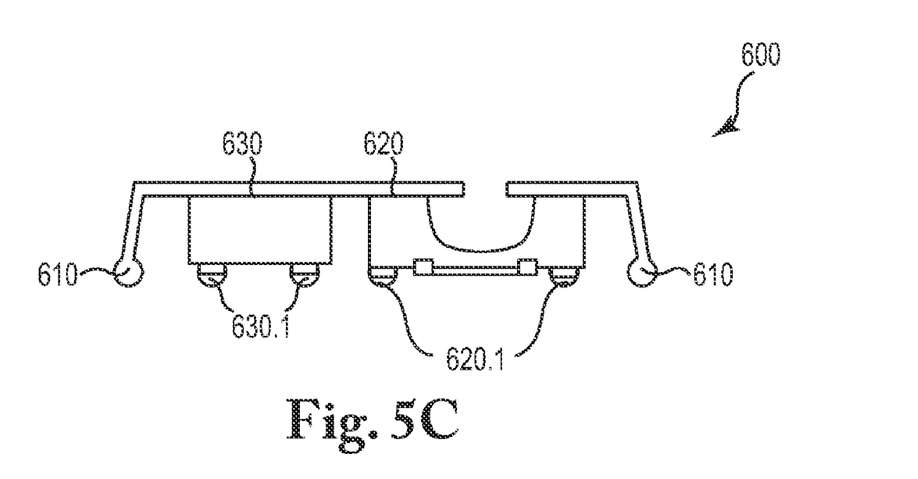
FIG. 5C illustrates a sectional side view of a sensor module according to one embodiment.

Referring to FIG. 5C, there is illustrated a sectional side view of one embodiment of a sensor module. The sensor module 600 is similar to the sensor module 400 as illustrated in FIGS. 4A-C besides the fact that the end faces of the rim 610 and of the first and second connection elements 620.1 and 630.3 of the first and second semiconductor chips 620 and 630, respectively, are prepared in a way that they facilitate the later attaching of the sensor module 600 to a circuit board. In one embodiment a material like a soldering material is applied to the end faces of the rim 610 and the first connection elements 620.1 and the second connection elements 630.1. As a soldering material the compounds SnAg, SnPb, SnAgCu and AuSn could be used. According to a further embodiment other materials could be used to be applied onto the end faces of the rim 610 and the first contact elements 620.1 and the second contact elements 630.1, in one embodiment materials which are known to be easily contacted or wetted with soldering materials. As such materials, for example, NiAu, Au, Ag, and Sn could be used.

Figure 6A:
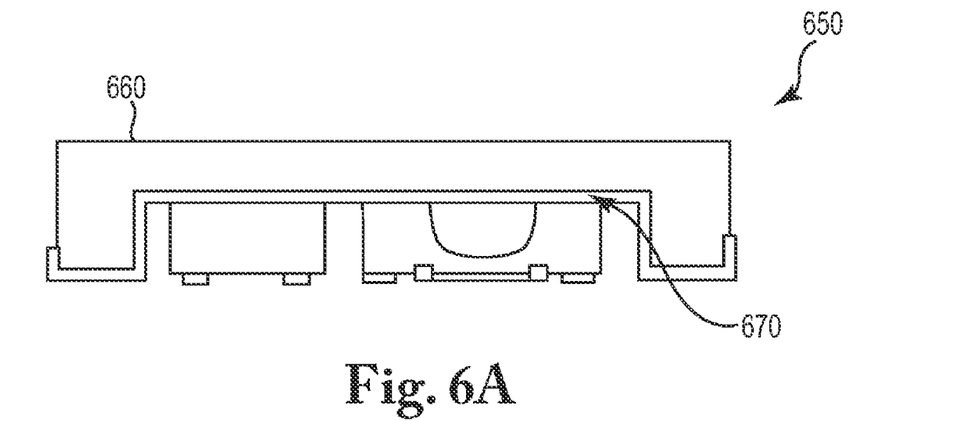
FIG. 6A illustrates a sectional side view of a sensor module according to one embodiment.

Referring to FIG. 6A, there is illustrated a sectional side view of a further embodiment of a sensor module. The sensor module 650 as illustrated in FIG. 6A is similar to the sensor module 400 of FIGS. 4A-C and in the following only the differences will be explained. The sensor module 650 as illustrated in FIG. 6A includes a cap 660 fabricated from a plastic material, in one embodiment a laminate material or any other electrically non-conductive material. The cap 660 is covered at a surface thereof with an electrically conductive layer 670 made of any electrically conductive material, in one embodiment a metallic material. The surface covered with the electrically conductive layer 670 extends over the entire inside bottom portion of the cap 660 to which the semiconductor chips are attached and extends over the closed rim portion which is to be contacted to the circuit board. The electrically conductive layer 670 thus serves as a shielding layer for shielding the semiconductor chips from spurious electrical signals from the outside.

Figure 6B:
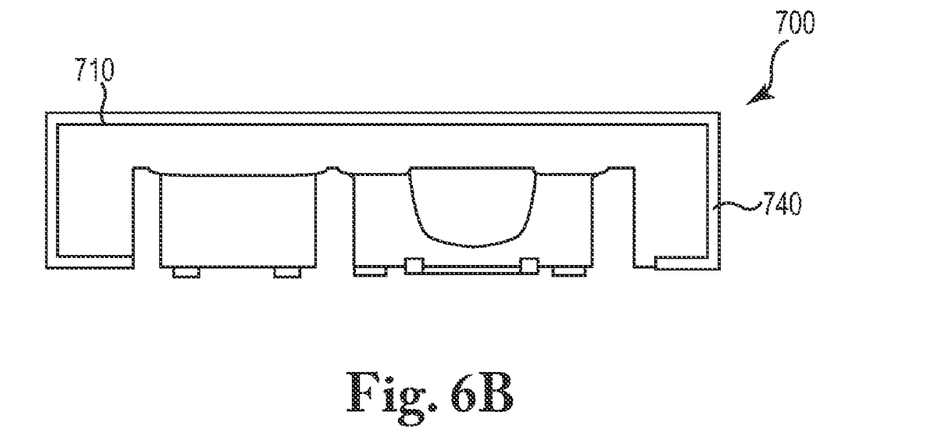
FIG. 6B illustrates a sectional side view of a sensor module according to one embodiment.

Referring to FIG. 6B, there is illustrated a sectional side view of a further embodiment of a sensor module. The sensor module 700 as illustrated in FIG. 6B is similar to the sensor module 650 of FIG. 6A besides the fact that an electrically conductive layer 740 is applied which extends on an outer surface of the cap 710 along the side surfaces and covering the rim portion which is to be contacted to the circuit board. The electrically conductive layer 740 will thus also serve as an effective shielding layer for shielding the semiconductor chips from spurious electrical signals from the outside.

Figure 7:
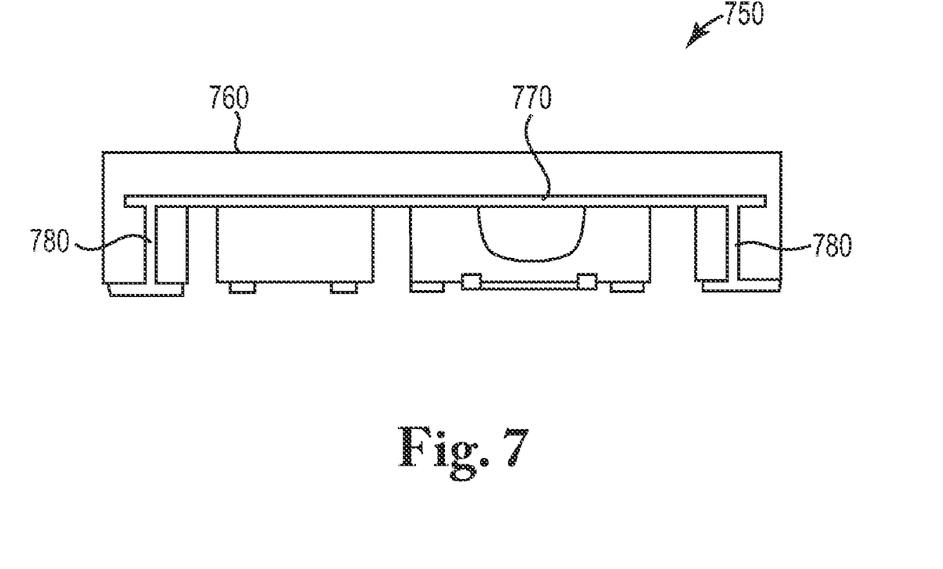
FIG. 7 illustrates a sectional side view of a sensor module according to one embodiment.

Referring to FIG. 7, there is illustrated a sectional side view of a further embodiment of a sensor module. The sensor module 750 as illustrated in FIG. 7 is similar to the sensor modules 650 and 700 of FIGS. 6A, B besides the fact that the electrically conductive layer 770 now extends over the bottom portion of the cap 760 and extends through via holes 780 to the rim extending on the end face of the rim of the cap 760. The electrically conductive layer 770 may thus also serve as effective shielding layer for shielding the semiconductor chips from spurious electrical signals from the outside.

Figure 8:
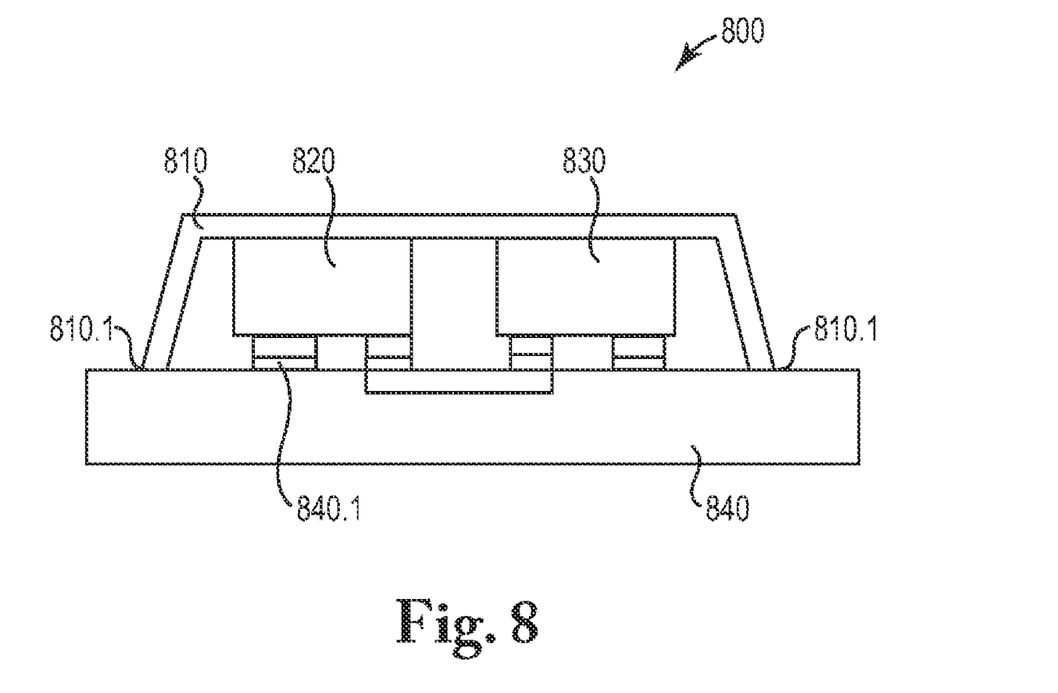
FIG. 8 illustrates a sectional side view of an assembly according to one embodiment.

Referring to FIG. 8, there is illustrated a sectional side view of one embodiment of an assembly. The assembly 800 as depicted in FIG. 8 includes a circuit board 840 including electrical connection elements 840.1, a cap 810 whose perimeter defines a rim 810.1, the rim 810.1 being attached to a main surface of the circuit board 840, a first semiconductor chip 820 attached between the cap 810 and the main surface of the circuit board 840, a second semiconductor chip 830 attached between the cap 810 and the main surface of the circuit board 840, the first and second semiconductor chips 820 and 830 electrically connected to each other by at least one of the electrical connection elements 840.1.

According to one embodiment of the assembly 800, the cap 810 is made of an electrically conductive material, or the cap 810 includes a surface being covered with an electrically conductive material, in one embodiment being essentially completely covered with an electrically conductive material.

According to one embodiment of the assembly 800 at least one of the first and second semiconductor chips 820 and 830 defines a front side and a backside, wherein the backside of the chip is attached to the cap 810 and wherein the connection elements of the chip are attached to the front side of the chip.

According to one embodiment of the assembly 800, the cap 810 and the attached first and second semiconductor chips 820 and 830 form a sensor module. In one embodiment, the first semiconductor chip 820 can be a microphone chip and the second semiconductor chip 830 can be a processor chip like an ASIC chip.

Figure 9A:
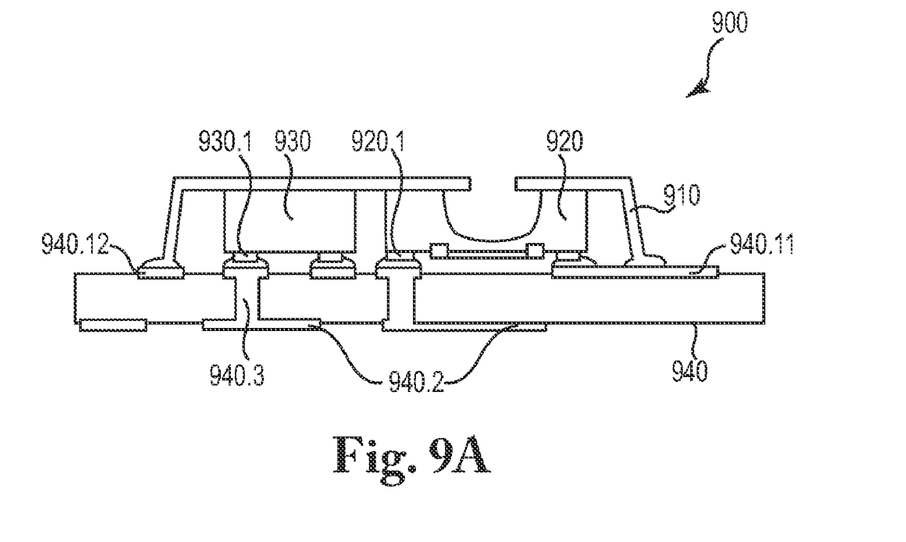
FIGS. 9A, B illustrate a sectional side view of an assembly according to one embodiment (A), and a top view of a circuit board of the assembly according to one embodiment.

Referring to FIGS. 9A, B, there is illustrated a sectional side view of a further embodiment of an assembly (A) and a top view of a circuit board used in the assembly (B). FIG. 9A depicts an assembly 900 including a circuit board 940 and a sensor module attached to the circuit board 940, the sensor module including a cap 910 and a first semiconductor chip 920 attached to the cap 910, and a second semiconductor chip 930 attached to the cap 910. The structure of the sensor module is the same as that of the sensor module 400 as illustrated in connection with FIGS. 4A-C so that further description thereof will not be repeated here. The circuit board 940 includes upper contact elements arranged on an upper surface of the circuit board 940 and lower contact elements 940.2 arranged on a lower surface of the circuit board 940. The circuit board 940 may further include via connections 940.3 for connecting particular ones of the upper contact elements to particular ones of the lower contact elements 940.2. In the embodiment of the assembly 900 the first and second semiconductor chips 920 and 930 are connected with each other by using two of the upper contact elements which will be illustrated in connection with FIG. 9B.

Figure 9B:
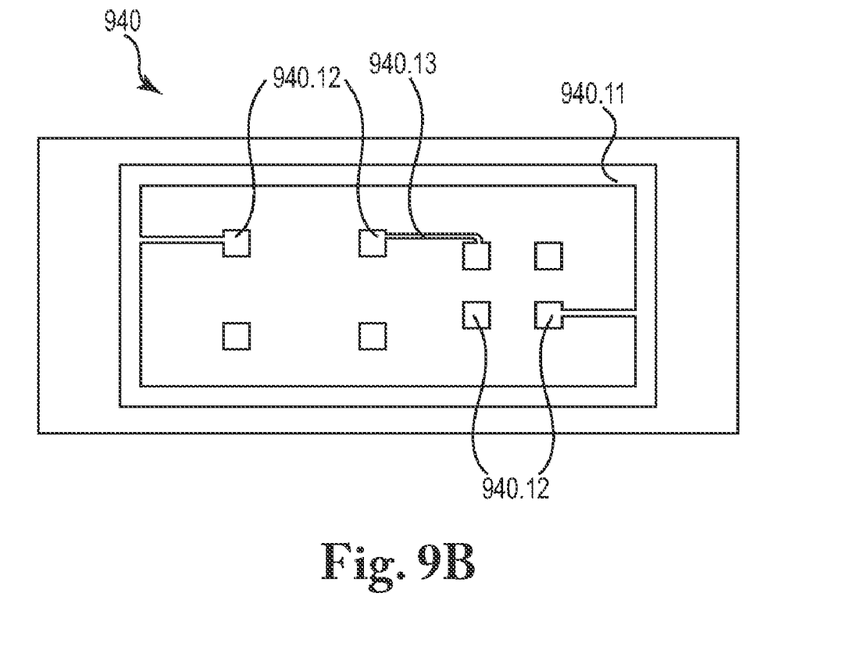

FIG. 9B illustrates a top view of the upper surface of the circuit board 940. The layout of the upper contact elements arranged on the upper surface is to be compared with FIG. 4B showing the first and second semiconductor chips 420 and 430 and their respective connection elements 420.1 and 430.1 as well as the rim 410.1 of the cap 410. The upper contact elements include a mass contact element 940.11 which is essentially a closed ring of a rectangular cross-section and which corresponds to the form of the rim of the cap 910. The mass contact element 940.11 itself defines a mass potential of the assembly 900 or it may be connected to an external mass terminal (not illustrated). As the cap 910 is used for shielding the semiconductor chips, it is connected with the mass connection element 940.11 so that the cap 910 lies on mass potential. The upper contact 940.1 further include chip contact elements 940.12 which are to be connected with the first and second connection elements 920.1 and 930.1 of the first and second semiconductor chips 920 and 930, respectively. There are provided four chip contact elements 940.12 for each one of the two semiconductor chips 920 and 930, respectively. In addition, in each chip-related group of chip contact elements 940.12 one of the chip contact elements 940.1 is also connected to the mass contact element 940.11 so that each one of the semiconductor chips can be connected to the mass potential. The first and second semiconductor chips can be connected to each other by using an electrical connection element 940.13 which consists of an electrical line connecting a particular one of the chip contact elements 940.12 of one chip related group of contact elements 940.12 to another one of the chip contact elements 940.12 of the respective other chip related group of chip contact elements 940.12. As illustrated in FIG. 9A, each one of the first and second semiconductor chips 920 and 930 is also connected to one of the lower contact elements 940.2 on the lower surface of the circuit board 940, respectively, by connecting one connection element of the respective chip to one of the chip contact elements 940.12 which is connected to one of the lower contact elements 940.2 by a via connection 940.3.

Figure 10:
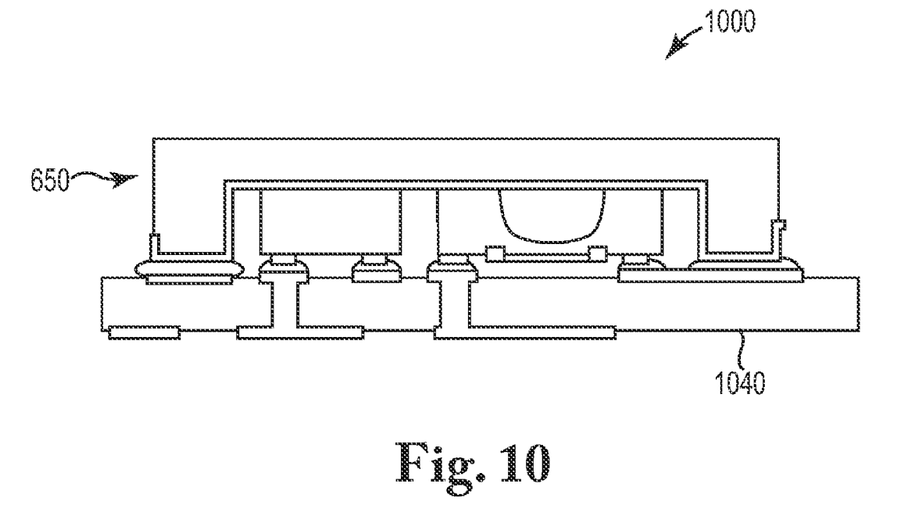
FIG. 10 illustrates a sectional side view of an assembly according to one embodiment.

Referring to FIG. 10, there is illustrated a sectional side view of a further embodiment of an assembly. The assembly 1000 as depicted in FIG. 10 is to be compared with FIG. 6A in which one embodiment of a sensor module 650 is illustrated. FIG. 10 illustrates an assembly 100 in which a sensor module 650 is attached to a circuit board 1040 wherein the circuit board 1040 can be identical or similar to the circuit board 940 as described in connection with FIGS. 9A, B.

Figure 11:
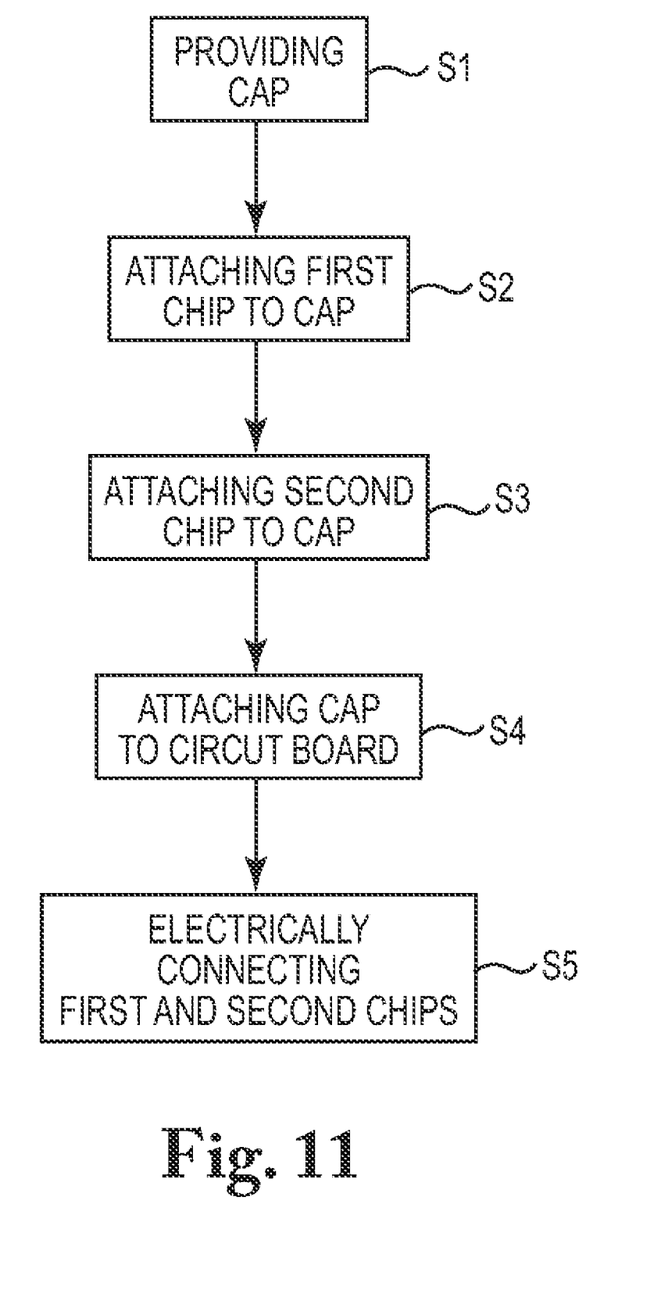
FIG. 11 illustrates a flow chart of a method for fabricating an assembly.

Referring to FIG. 11, there is illustrated a flow chart of one embodiment of a method for fabricating an assembly. The method includes providing a cap (s1), attaching a first semiconductor chip to the cap (s2), attaching a second semiconductor chip to the cap (s3), attaching the cap to a circuit board, the circuit board including electrical connection elements (s4), and electrically connecting the first and second semiconductor chips to each other by using at least one of the electrical connection elements of the circuit board (s5).

According to one embodiment of the method for fabricating an assembly, a cap is provided which is made of an electrically conductive material, or a surface of the cap is covered with an electrically conductive material, in one embodiment the surface of the cap is essentially completely covered with an electrically conductive material. For further optional features with respect to the providing of the cap, reference is made to FIGS. 1 to 3 and 4A and the respective description thereof.

According to one embodiment of the method for fabricating an assembly, at least one of the first and second semiconductor chips is attached to the cap by attaching a backside of the chip to the cap so that a rim of the cap and connection elements on a front side of the chip define a common plane. For further optional features with respect to the attaching of the first and second semiconductor chips, reference is made to FIGS. 2 and 4A and the respective description thereof.

According to one embodiment of the method for fabricating an assembly, the cap is attached to the circuit board by using one or more of a soldering process and a re-flow process. In one embodiment the soldering process can be carried out as a soldering paste process in which soldering material is applied to upper contact elements on an upper surface of the circuit board and after applying the cap to the circuit board a re-flow process is carried out to firmly attach the connection elements of the semiconductor chips and the rim of the cap to the upper contact elements of the circuit board.

According to one embodiment of the method for fabricating an assembly, a soldering material is applied to one or more of a rim of the cap, connection elements of one or more of the first and second semiconductor chips, and the contact elements of the circuit board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A sensor module, comprising:
a cap whose perimeter defines a rim;
a first semiconductor chip attached to the cap;
wherein the first semiconductor chip comprises first connection elements,
wherein the rim and the first connection elements define a common plane, and
wherein the first semiconductor chip is a microphone chip and an opening is formed in the cap through which sound waves may enter in the direction of the microphone chip, the microphone chip comprising a front surface and a back surface and the first connection elements are located on the front surface and the microphone chip is attached with the back surface to the cap, and
wherein a recess is formed in the back surface of the microphone chip and the recess is in direct communication with the opening of the cap.
2. The sensor module of claim 1, further comprising:
a second semiconductor chip comprising second connection elements and attached to the cap.

3. The sensor module of claim 2, wherein the first connection elements and the second connection elements are electrically connected to each other via a circuit board.

4. The sensor module of claim 1, wherein the cap is made of an electrically conductive material, or the cap comprises a surface being covered with an electrically conductive material.

5. The sensor module of claim 4, wherein the cap comprises a surface being essentially completely covered with an electrically conductive material.

6. A sensor module, comprising:
a cap whose perimeter defines a rim;
a first semiconductor chip comprising first connection elements and attached to the cap; and
a second semiconductor chip comprising second connection elements and attached to the cap,
wherein the first semiconductor chip is a microphone chip and an opening is formed in the cap through which sound waves may enter in the direction of the microphone chip, the microphone chip comprising a front surface and a back surface and the first connection elements are located on the front surface and the microphone chip is attached with the back surface to the cap, and
wherein a recess is formed in the back surface of the microphone chip and the recess is in direct communication with the opening of the cap.

7. The sensor module of claim 6, wherein the rim and at least one of the first and second connection elements define a common plane.

8. The sensor module of claim 6, wherein the cap is made of an electrically conductive material or the cap comprises a surface being covered with an electrically conductive material.

9. The sensor module of claim 8, wherein the cap comprises a surface being essentially completely covered with an electrically conductive material.

10. The sensor module of claim 6, wherein the second semiconductor chip defines a front side and a backside,
wherein the backside of the second semiconductor chip is attached to the cap, and
wherein the connection elements of the second semiconductor chip are attached to the front side of the second semiconductor chip.

11. A sensor module, comprising:
a cap made of an electrically conductive material;
or a cap having a surface being covered with an electrically conductive material; and
a first semiconductor chip attached to the cap,
wherein the first semiconductor chip is a microphone chip and an opening is formed in the cap through which sound waves may enter in the direction of the microphone chip, the microphone chip comprising a front surface and a back surface and first connection elements are located on the front surface and the microphone chip is attached with the back surface to the cap, and
wherein a recess is formed in the back surface of the microphone chip and the recess is in direct communication with the opening of the cap.

12. The sensor module of claim 11, wherein the perimeter of the cap defines a rim, and the rim and the first connection elements define a common plane.

13. The sensor module of claim 11, further comprising:
a second semiconductor chip comprising second connection elements and attached to the cap.

14. The sensor module of claim 13, wherein the first connection elements and the second connection elements are electrically connected to each other via a circuit board.

15. The sensor module of claim 13, wherein the second semiconductor chip defines a front side and a backside,
wherein the backside of the second semiconductor chip is attached to the cap, and
wherein the connection elements of the second semiconductor chip are attached to the front side of the second semiconductor chip.

16. A sensor module, comprising:
a cap whose perimeter defines a rim;
a first semiconductor chip attached to the cap;
wherein the first semiconductor chip comprises first connection elements,
wherein the rim and the first connection elements define a common plane,
wherein the first semiconductor chip is a microphone chip and an opening is formed in the cap through which sound waves may enter in the direction of the microphone chip, the microphone chip comprising a front surface and a back surface and the first connection elements are located on the front surface and the microphone chip is attached with the back surface to the cap, and
wherein the microphone chip comprises a membrane, the membrane being located at the front surface of the microphone chip.

17. The sensor module of claim 16, further comprising:
a second semiconductor chip comprising second connection elements and attached to the cap.

18. The sensor module of claim 7, wherein the first connection elements and the second connection elements are electrically connected to each other via a circuit board.

19. The sensor module of claim 6, wherein the cap is made of an electrically conductive material, or the cap comprises a surface being covered with an electrically conductive material.

20. The sensor module of claim 9, wherein the cap comprises a surface being essentially completely covered with an electrically conductive material.

21. A sensor module, comprising:
a cap whose perimeter defines a rim;
a first semiconductor chip comprising first connection elements and attached to the cap; and
a second semiconductor chip comprising second connection elements and attached to the cap,
wherein the first semiconductor chip is a microphone chip and an opening is formed in the cap through which sound waves may enter in the direction of the microphone chip, the microphone chip comprising a front surface and a back surface and the first connection elements are located on the front surface and the microphone chip is attached with the back surface to the cap, and
wherein the microphone chip comprises a membrane, the membrane being located at the front surface of the microphone chip.

22. The sensor module of claim 21, wherein the rim and at least one of the first and second connection elements define a common plane.

23. The sensor module of claim 21, wherein the cap is made of an electrically conductive material or the cap comprises a surface being covered with an electrically conductive material.

24. The sensor module of claim 23, wherein the cap comprises a surface being essentially completely covered with an electrically conductive material.

25. A sensor module, comprising:
a cap made of an electrically conductive material;
or a cap having a surface being covered with an electrically conductive material; and
a first semiconductor chip attached to the cap,
wherein the first semiconductor chip is a microphone chip and an opening is formed in the cap through which sound waves may enter in the direction of the microphone chip, the microphone chip comprising a front surface and a back surface and first connection elements are located on the front surface and the microphone chip is attached with the back surface to the cap, and wherein the microphone chip comprises a membrane, the membrane being located at the front surface of the microphone chip.

\* \* \* \* \*

UNITED STATES PATENT AND TRADEMARK OFFICE
CERTIFICATE OF CORRECTION

PATENT NO. : 8,130,506 B2
APPLICATION NO. : 12/142380
DATED : March 6, 2012
INVENTOR(S) : Horst Theuss It is certified that error appears in the above-identified patent and that said Letters Patent is hereby corrected as shown below:

Column 10, line 21, delete "and".

Column 10, line 24, delete "chip." and insert in place thereof --chip, and wherein a recess is formed in the back surface of the microphone chip and the recess is in direct communication with the opening of the cap--.

Column 10, line 28, delete "7" and insert in place thereof --17--.

Column 10, line 31, delete "6" and insert in place thereof --16--.

Column 10, line 35, delete "9" and insert in place thereof --19--.

Column 10, line 50, delete "and".

Column 10, line 53, delete "chip." and insert in place thereof --chip, and wherein a recess is formed in the back surface of the microphone chip and the recess is in direct communication with the opening of the cap--.

Column 11, line 5, delete "and".

Column 12, line 3, delete "chip." and insert in place thereof

Signed and Sealed this
Twenty-second Day of May, 2012

David J. Kappos
*Director of the United States Patent and Trademark Office*

--chip, and wherein a recess is formed in the back surface of the microphone chip and the recess is in direct communication with the opening of the cap--.